United States Patent [19]

Tien

[11] 4,410,862

[45] Oct. 18, 1983

[54] MOSFET MULTIVIBRATOR WITH DUAL TIMING

[75] Inventor: Paul C. Tien, Lexington, Ky.

[73] Assignee: International Business Machines Corporation, Armonk, N.Y.

[21] Appl. No.: 262,728

[22] Filed: May 12, 1981

[51] Int. Cl.³ .......................................... H03K 3/353
[52] U.S. Cl. ............................ 331/113 R; 331/108 D
[58] Field of Search ................. 331/113 R, 108 D, 111

[56] References Cited

U.S. PATENT DOCUMENTS

| | | | |
|---|---|---|---|
| 3,748,591 | 7/1973 | Visioli, Jr. et al. | 331/111 X |
| 3,863,179 | 1/1975 | Goo | 331/108 D |
| 3,878,482 | 4/1975 | Schowe | 331/108 D |
| 4,083,019 | 4/1975 | Hamada et al. | 331/113 R |
| 4,336,508 | 6/1982 | Cole et al. | 331/113 R |

*Primary Examiner*—Siegfried H. Grimm
*Assistant Examiner*—Edward P. Westin
*Attorney, Agent, or Firm*—John A. Brady

[57] ABSTRACT

Accurate and reliable multivibrators are achieved having most of the advantages of on-chip circuits and producing signals with long cycle periods. An off-chip capacitor (1) in an RC timing circuit is charged during the period defined by on-chip capacitor (31) and resistance (33 and 11) RC timing circuit. The cross-coupled circuit has switches (17) and (19) on at least one side, each effective to connect operating potential to respective ones of the two RC circuits. Each has at least two switches (190) and (270) connected in parallel on the other side of the circuit, each operated by respective ones of the two RC circuits of the first side to hold the other side to ground until both RC circuits have operated for preselected periods. Bootstrap voltage from a capacitor (51) is employed to gate the switch FET (45) to the off-chip capacitor (1) strongly on.

8 Claims, 2 Drawing Figures

MOSFET MULTIVIBRATOR WITH DUAL TIMING

TECHNICAL FIELD

This invention relates to multivibrators fabricated with most elements on a single substrate. The active circuit elements are gated field effect transistors (FETs) commonly known as MOSFETs (this meaning metal oxide semiconductor field effect transistor or the direct structural equivalent). Where a number of such elements are fabricated on the same substrate, with the substrate having input pads, pins and the like for connection to elements off the substrate, the elements on the substrate are said to be on the same chip.

This invention relates to such multivibrators having off-chip timing circuit elements and on-chip timing elements.

BACKGROUND ART

A standard conventional electrical timing circuit is the resistance and capacitance series (RC) circuit. On-chip elements to implement such a circuit are generally quite small and, in particular, the capacitances are relatively small. Consequently, where a relatively long time is to be defined by electrical elements, on-chip circuits are often not practical. Known prior art circuits have connections to timing circuit elements off-chip, which typically are physically much larger and have correspondingly larger electrical impedances.

Solid state oscillators and the like with off-chip timing capacitor circuits appear in the following prior art patents: U.S. Pat. Nos. 3,748,591 to Visioli et al.; 3,863,179 to Goo; 3,878,492 to Schowe; and 4,083,019 to Hamada et al. In view of such teachings as well as other less pertinent references, it is hereby acknowledged that no novelty significant toward patentability exists in an off-chip timing circuit per se. Similarly, the use of an on-chip timing circuit is a standard design alternative known in the prior art, and, of course, the cross coupling of circuit elements with appropriate timing elements to form a multivibrator is entirely conventional.

DISCLOSURE OF THE INVENTION

In accordance with this invention a multivibrator circuit has an off-chip RC timing circuit which is charged under control of an on-chip RC timing circuit. When the on-chip timing circuit reaches a predetermined status, the connection of operating voltage to the off-chip capacitor is terminated by an FET in that circuit being gated off. The off-chip RC circuit then begins to discharge. The voltage at the off-chip capacitor is connected to the gate of those FETs in a cross-coupled configuration which had been gated on. When that voltage drops below the gate threshold voltage, the cross-coupled circuit is switched.

The circuit can be unsymmetrical, with long off-chip timing as described at on one side, but only short on-chip timing on the other side. This generates short pulses at regular intervals separated by relatively great intervals.

The circuits have most of the economies and low-power requirements of on-chip circuits while having long cycle periods. They have accurate and reliable operation.

BEST MODE FOR CARRYING OUT THE INVENTION

A depletion-mode FET with gate and source shunted together is effectively a resistor. A MOSFET connected with source and drain shunted together is effectively a capacitor. A depletion-mode FET is gated on when the input to the gate is at ground and even somewhat lower. A FET switch is operated by being gated on and off. The following description employs descriptions and terminology assuming these facts. Unless otherwise indicated, the FETs are enhancement-mode devices, which require potential at the gate above a threshold to be gated on.

FIG. 1 ELEMENTS

Figure 1:
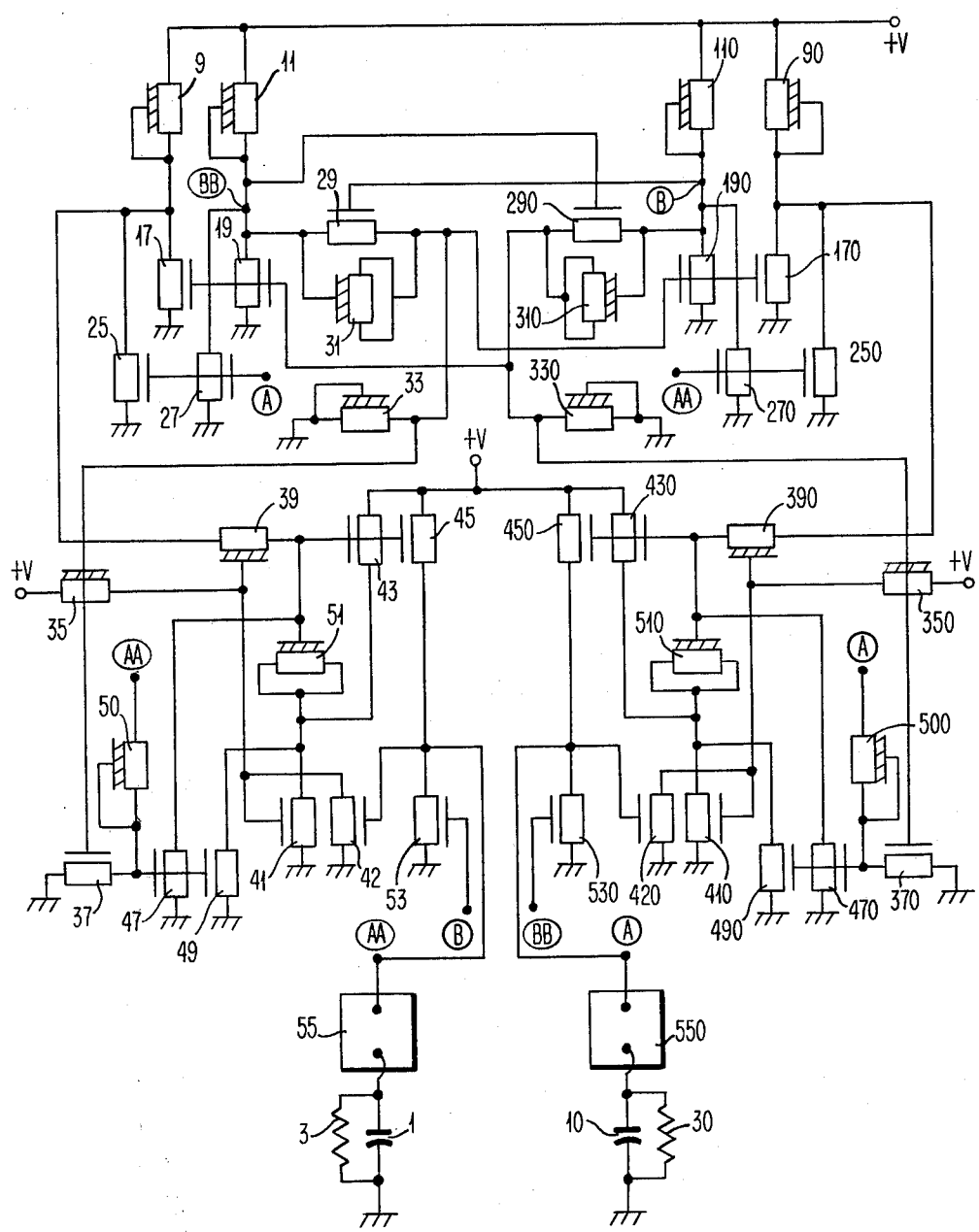
FIG. 1 is the circuit diagram of the symmetrical embodiment.

In the circuit of FIG. 1, all of the elements are constructed on the same substrate except off-chip capacitor 1 in parallel with off-chip resistor 3 and off-chip capacitor 10 in parallel with off-chip resistor 30. The other active circuit elements are on-chip. The chip, as is conventional, has a substrate and a substrate-bias source, not shown.

The chip elements have an operating potential +V, which is connected to depletion-mode FET resistors 9, 11, 110 and 90. The magnitude of the resistance of each such resistor is selected by the dimensions of the gate, source and drain elements of the FET making the resistor. FET switches 17, 19, 190 and 170 each are connected to the FET resistors 9, 11, 110 and 90 respectively.

The junction of FET resistor 9 and FET switch 17 is connected to the drain of FET switch 25, the source of which is connected to ground and the gate of which is connected to node A (indicated in the drawing by the A in a circle). The junction of FET resistor 11 and FET switch 19 is connected to the drain of FET switch 27, the source of which is connected to ground and the gate of which is also connected to node A.

The entirely symmetrical configuration of the FIG. 1 circuit will be apparent. Circuit elements on the right side of the circuit are assigned a numeral ten times larger that the corresponding circuit element on the left side. For example, FET switch 250 on the right side is identical in characteristics and connection in the circuit to FET switch 25 on the left side. The nodes interconnect the cross-coupled circuit as will be clear. Nodes on the one side are indicated with an arbitrary letter while corresponding nodes of the other side are indicated by the letter twice. For example, node A on the left side corresponds exactly to node AA on the right side. Because of this direct equivalence of the left and right side, the right side will not be described or mentioned in detail except where some need to do so exists which is not satisfied by description of the left side.

The junction of FET resistor 11 and FET switch 19 is connected to a terminal of FET switch 29, which is in parallel with depletion-mode FET capacitor 31. The opposite junction of switch 29 and capacitor 31 is connected to the gates of switches 170 and 190, and to depletion-mode FET resistor 33, the opposite terminal of which is connected to ground. That junction of switch 29 and capacitor 31 is also connected to the gate of depletion-mode FEt current-limiter 35 and to the gate of FET switch 37.

The operating potential, +V, is connected to one terminal of FET 35 and the other terminal is connected to the gate of depletion-mode FET 39, to the gate of FET switch 41 and to the drain of FET switch 42. One terminal of FET 39 is connected to the junction of resistor 9 and switches 17 and 25. The other terminal of FET 39 is connected to the gates of FET switches 43 and 45.

One side of switch 37 is connected to ground while the other side is connected to the gates of FET switches 47 and 49, the sources of which are connected to ground. The gates of FET switches 47 and 49 are also connected through depletion-mode FET resistor 50 to node AA. The drain of switch 47 is connected to the gate of depletion-mode FET capacitor 51, the gate of which is also connected to the gates of switches 43 and 45. The other side of capacitor 51 is connected to the drain of switch 49, the drain of switch 41, and the source of switch 43.

Depletion-mode transistors 35 and 50 serve only to limit undesirably high currents.

The drains of switches 43 and 45 are connected to the operating voltage +V. The source of switch 45 is connected to the drain of FET switch 53. Switches 41, 42, and 53 have their sources connected to ground. The gate of switch 53 is connected to node B, the junction of resistor 110 and switch 190 also being connected to node B. The gate of switch 42 is connected to node AA.

Node AA connects to chip-exit-connection pad 55, to which is connected the off-chip RC circuit of capacitor 1 and resistor 3. Similarly node A connects to chip-exit-connection pad 550, to which is connected the capacitor 10 and resistor 30.

FIG. 1 OPERATION

Operation of the FIG. 1 circuit can be understood by assuming an initial status at which capacitor 31 is discharged and switches 17, 19, 25 and 27 are gated off. Current from +V flows through resistor 11, through capacitor 31 and gates on switches 170 and 190, thereby grounding resistors 90 and 110 and gating switch 29 off. Current through resistor 11 continues to flow through capacitor 31 and through resistor 33 to ground. While sufficient of this current is flowing, switch 37 is gated on, thereby gating off switches 47 and 49.

At the same time potential from current through resistor 9 passes through FET 39 and gates switches 43 and 45 on. Node B goes to ground, which gates switch 53 off. Capacitor 1 begins to charge from current through switch 45, while capacitor 51 is charged through switch 39, which is gated on by potential conducted through current-limiter FET 35.

When capacitor 1 is charged to the gate-on potential (the threshold voltage) of switch 42, switch 42 turns on and grounds the gate of switch 41, thereby turning switch 41 and switch 39 off. (Switch 39 has operating potential on both source and drain and is therefore gated off by a ground potential.) Capacitor 51 functions as a bootstrap capacitor since the potential across capacitor 51 is then in series with the potential across switch 43, thus raising the potential at gates of switches 43 and 45 to in the order of magnitude of twice +V. Switch 45 is thereby gated on hard to charge capacitor 1.

Because switches 17 and 19 are in separate paths, the reliability of potential to the capacitor 31, resistor 33 circuit is not influenced by current resulting from the closing of switch 17. Under control of the RC timing effect of capacitor 31 and resistors 33 and 11, at a preselected time switch 37 is gated off. This is designed to be after capacitor 1 will be fully charged. Switches 170 and 190 in the right side of the multivibrator circuit are no longer gated on, but node AA is now high so parallel switches 250 and 270 are gated on. Switches 47 and 49 are gated on through resistor 50, which is connected to node AA.

The gating on of switches 47 and 49 gates off switches 43 and 45, thereby isolating the timing circuit of capacitor 1 and resistor 3. That circuit begins to discharge and when the potential of node AA drops the threshold potential of switches 250 and 270, those switches are turned off.

Capacitor 310 has been discharged through switch 290, gated on by the high potential at the junction of resistor 11 and switch 19. When the switches 250 and 270 turn off, current begins to flow through capacitor 310 in the manner and having the effect described in the foregoing discussion beginning with current flowing through capacitor 31. The two sides are thus cross-coupled and function alternately and symmetrically as an astable multivibrator. Switch 53 is gated on to fully discharge capacitor 1 as the potential of node B goes high.

The output signal may be taken from node B or node BB. A symmetrical, square wave of equal periods at +V and ground is obtained at either node, each of opposite phase from the other.

FIG. 2 EMBODIMENT

In certain applications a brief pulse followed by a long delay is the desired wave form. Such a long delay can be readily achieved using large, off-chip circuit elements. The circuit of FIG. 2 is an embodiment of this invention to obtain such an unsymmetrical wave form, with a relatively long delay between short voltage pulses.

Figure 2:
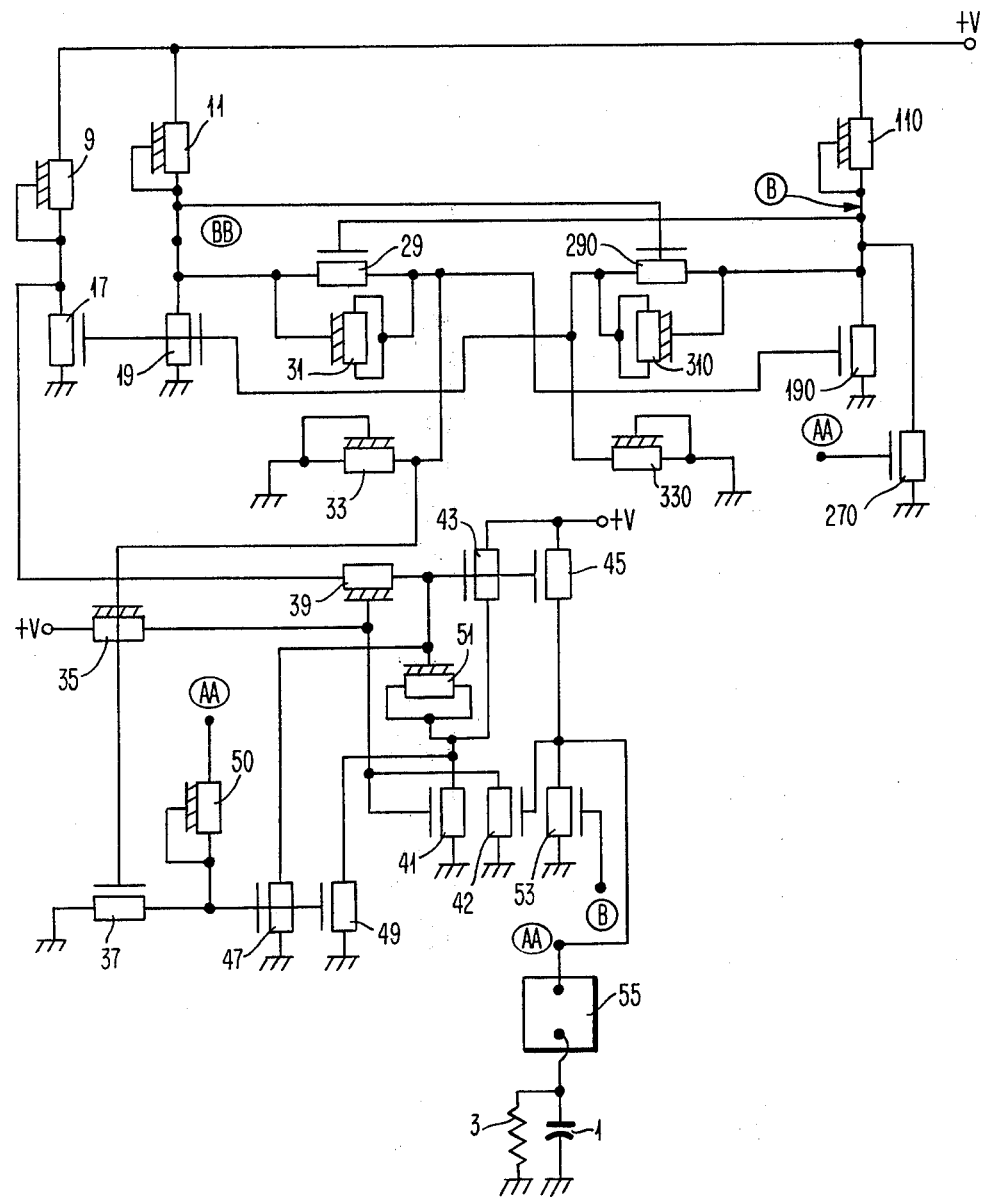
FIG. 2 is the circuit diagram of the unsymmetrical embodiment.

As will be apparent from brief inspection, the FIG. 2 circuit differs from the FIG. 1 circuit in eliminating the off-chip RC circuit elements 10 and 30 of the right side and elements directly associating with the charging and the responding to the discharge of those elements. On the left side switches 25 and 27 are eliminated. On the right side only resistor 110, switches 190, 270 and 290, capacitor 310, and resistor 330 remain.

Since switches 25 and 27 do not appear in this embodiment, that is equivalent to them being switched off, as was the status in the foregoing description of operation at the point at which capacitor 31 was just beginning to be charged. Accordingly, the subsequent charging of capacitor 1, timed by the RC circuit of capacitor 31 and resistors 33 and 11, followed by the discharge of the capacitor 1 through resistor 3 is just as described in the foregoing with respect to the FIG. 1 embodiment.

When the level of node AA turns switch 270 off, switch 190 is already off, so node B goes high and switches 17, 19, 29 and 53 are gated on. The charging of the left side capacitors is directly terminated by the grounds applied by switches 17 and 19. Capacitor 31 is discharged through switch 29. Capacitor 1 is discharged through switch 53.

Under control of the RC timing effect of capacitor 310 and resistors 330 and 110, at a preselected time switches 17 and 19 are gated off. Since switches 25 and 27 do not exist in this embodiment, capacitor 31 begins to pass charge, which gates switch 190 on, bringing node B to ground.

A full, unsymmetrical cycle is thereby completed, and continues in the same manner. An output taken at node B exhibits a relatively long period at ground follow by a short positive pulse dictated only by the impedances of the RC circuit of capacitor 310 and resistors 330 and 110.

CIRCUIT CHARACTERISTICS

The time for the potential passed by FET capacitors 31 and 310 to drop from the initial, highest level to less than the threshold of the switches they control is in the order of microseconds. The time to charge the large, off-chip capacitors 1 and 10 is typically in the range of two hundred nanoseconds at most. Accordingly, the necessary requirement that the on-chip RC circuit not time out before the off-chip capacitor is charged can be satisfied with a wide margin of safety.

In the FIG. 2 embodiment, the short-pulse period can be 1 microsecond or less while the interval between pulses can be 2 to 3 milliseconds.

It will be apparent that the foregoing circuit design can be modified with alternatives while preserving the basic function of the elements and their interaction. Accordingly, patent protection should not be limited to the specific embodiments disclosed, but should be as provided by law, with particular reference to the accompanying claims.

What is claimed is:

1. A cross-coupled multivibrator circuit having two sides and having solid-state active elements and circuit impedance elements fabricated on a substrate wherein the improvement comprises said circuit having a passive timing circuit on said substrate adapted to control connection of a charging potential to a capacitor separate from said substrate for a time sufficient to fully charge said off-substrate capacitor, said on-substrate timing circuit then bringing the control terminal of an active element on said substrate to a status to disconnect said charging potential from said off-substrate capacitor, said off-substrate capacitor being connected to a resistance and to elements in said multivibrator effective when said off-substrate capacitor is discharged through said resistance a predetermined amount to reverse the status of the control terminal of an active element in said cross-coupled multivibrator and thereby switch said multivibrator.

2. The multivibrator circuit as in claim 1 in which at least one of said sides comprises a first switch connected when operated to switch out of operation said passive timing circuit in said one side and said one side also comprises a second switch connected when operated to switch out of operation said charging potential to said off-substrate capacitor in said one side.

3. The multivibrator circuit as in claim 1 in which at least the first of said sides comprises two switches in parallel and the second of said sides comprises said passive timing circuit and said off-substrate capacitor, one of said parallel switches being connected to be controlled by said passive timing circuit of said second side and the other parallel switch being connected to be controlled by said off-substrate capacitor of said second side, the side having said parallel switches being held inactive by said switches until both are operated by the respective controlling circuit reaching a given status.

4. The multivibrator circuit as in claim 3 in which at least said second side comprises a first switch connected when operated to switch out of operation said passive timing circuit in said second side and said second side also comprises a second switch connected when operated to switch out of operation said charging potential to said off-substrate capacitor in said second side, said first side being connected through another on-substrate, passive timing circuit to operate for a preselected period said first switch and said second switch when said first side is active.

5. The circuit as in claim 4 which is symmetrical by having essentially identical circuit elements and directly corresponding circuit connections on each side.

6. The circuit as in claim 4 also comprising a bootstrap on-substrate capacitor on said second side, said off-substrate capacitor of said second side being charged through an FET switch, and said bootstrap capacitor being connected to be charged during the first portion of the period of operation of said passive timing circuit of said second side, said bootstrap capacitor being connected to then be switched into the control circuit of said FET switch in a polarity to gate said FET switch on.

7. The circuit as in claim 6 which is symmetrical by having essentially identical circuit elements and directly corresponding circuit connections on each side.

8. The circuit as in claim 6 having said two switches in parallel only in said first side, and having said first switch, said second switch and said off-substrate capacitor only in said second side connected to produce an unsymmetrical repetitive output wave form having a first state for a period defined by the period from the activation of said passive timing circuit in said second side until the said status of that timing circuit disconnects the charging potential from said off-substrate capacitor plus the period for said off-substrate capacitor to discharge to a level at which said parallel switch controlled by said off-substrate capacitor is operated, said wave form having a second state for a period defined by the period from the activation of said passive timing circuit in said first side until the said status of that timing circuit at which said first switch and said second switch are not operated.

* * * * *